US011729592B2

(12) United States Patent
Cavacuiti et al.

(10) Patent No.: US 11,729,592 B2
(45) Date of Patent: Aug. 15, 2023

(54) ANGLE OF ARRIVAL COMMISSIONING OF LIGHTING DEVICES

(71) Applicant: Universal Lighting Technologies Inc., Nashville, TN (US)

(72) Inventors: John Cavacuiti, Burnaby (CA); Masaaki Ikehara, Burnaby (CA)

(73) Assignee: UNIVERSAL LIGHTING TECHNOLOGIES INC., Nashville, TN (US)

( * ) Notice: Subject to any disclaimer, the term of this patent is extended or adjusted under 35 U.S.C. 154(b) by 716 days.

(21) Appl. No.: 16/831,750

(22) Filed: Mar. 26, 2020

(65) Prior Publication Data

US 2021/0303746 A1    Sep. 30, 2021

(51) Int. Cl.
*H04W 4/80* (2018.01)
*H05B 47/19* (2020.01)

(52) U.S. Cl.
CPC .............. *H04W 4/80* (2018.02); *H05B 47/19* (2020.01)

(58) Field of Classification Search
CPC ........... H04W 4/80; H04W 4/02; H04W 4/33; H05B 47/19; H05B 45/20; H05B 45/30; G01S 3/46; G01S 5/0284; G06F 30/13; F21V 23/003; F21Y 2115/10
See application file for complete search history.

(56) References Cited

U.S. PATENT DOCUMENTS

| 10,306,419 B2 * | 5/2019 | Abou-Rizk | ............... G01S 5/04 |
| 2018/0341025 A1 * | 11/2018 | Vervisch-Picois | ........ G01S 5/10 |

FOREIGN PATENT DOCUMENTS

WO    WO 2017067922    *    4/2017    ............. H05B 33/08

OTHER PUBLICATIONS

International Search Report corresponding application No. PCT/JP2021/000442 dated Mar. 9, 2021.

* cited by examiner

*Primary Examiner* — Peggy A Neils
(74) *Attorney, Agent, or Firm* — Renner, Otto, Boisselle & Sklar, LLP

(57) ABSTRACT

A technique for commissioning of light sources may include receiving data indicating planned geographic positions of the light sources and data representing commissioning information of the light sources, receiving data indicating an actual geographic position of an angle of arrival receiver relative to the planned geographic positions of the light sources, receiving, at the angle of arrival receiver, beacon signals carrying respective light source identifiers that uniquely identify respective light sources, calculating actual geographic positions of the light sources based on a) the actual geographic position of the angle of arrival receiver relative to the planned geographic positions of the light sources and b) respective angles of arrival of the beacon signals, comparing the planned geographic positions to the actual geographic positions to correlate the commissioning information to the light source identifiers, and transmitting the correlated light source identifiers and commissioning information to the respective light sources.

9 Claims, 6 Drawing Sheets

ANGLE OF ARRIVAL COMMISSIONING OF LIGHTING DEVICES

BACKGROUND

Commissioning is a quality assurance process that ensures installed building systems perform interactively and continuously according to the owner's needs and the design intent. Commissioning answers the question, "Does the building and its systems perform according to what the owner wanted and the designer intended?" Therefore, the commissioning process begins with identifying the owner's project requirements and ends with ensuring the design intent, finished design, and installed systems satisfy these requirements. The benefits of commissioning include reduced energy and operating costs, enhanced property value and marketability, verification the building and its systems will perform as intended, and greater user acceptance and satisfaction.

The American Society of Heating, Refrigerating and Air-Conditioning Engineers (ASHRAE)'s Guideline 0-2005, The Commissioning Process, defines a process for commissioning whole buildings. In 2011, the Illuminating Engineering Society (IES) developed Design Guide 29, The Commissioning Process Applied to Lighting and Control Systems, which serves as a lighting-specific guide to The Commissioning Process described in Guideline 0.

In the lighting industry, the term "commissioning" is often applied to lighting control system activation or initial set up, in which a manufacturer's representative sets up and calibrates installed controls as a service. Commissioning may apply to an entire building and its energy-using systems, including lighting and controls. System activation and functional testing are steps within a larger process of ensuring all installed systems satisfy the design intent and owner's requirements.

In the example of a large building, warehouse, or retail store, the commissioning process may include assigning individual lighting devices including light sources to lighting groups, for the devices to be controlled or monitored differently depending on their assigned lighting group.

Conventionally, the commissioning process has been time-consuming in terms of worker hours and, therefore, has been slow, expensive, and mistake prone.

BRIEF SUMMARY OF THE INVENTION

The present disclosure discloses techniques that use angle of arrival technology to determine actual locations of lighting devices, correlates the actual locations to planned locations to identify the devices, and then transmits the commissioning information to the identified devices.

These novel techniques result in rapid commissioning of light sources, particularly as compared to other processes. Time required for commissioning of relatively large, commercial or industrial settings (which may include hundreds or thousands of light sources) using the techniques disclosed herein may be reduced significantly from the days or even weeks needed for other processes. The novel is process is also highly automated and is, therefore, less prone to mistakes. This may mean significant time and cost savings.

These and other advantages of the invention will become apparent when viewed in light of the accompanying drawings, examples, and detailed description.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
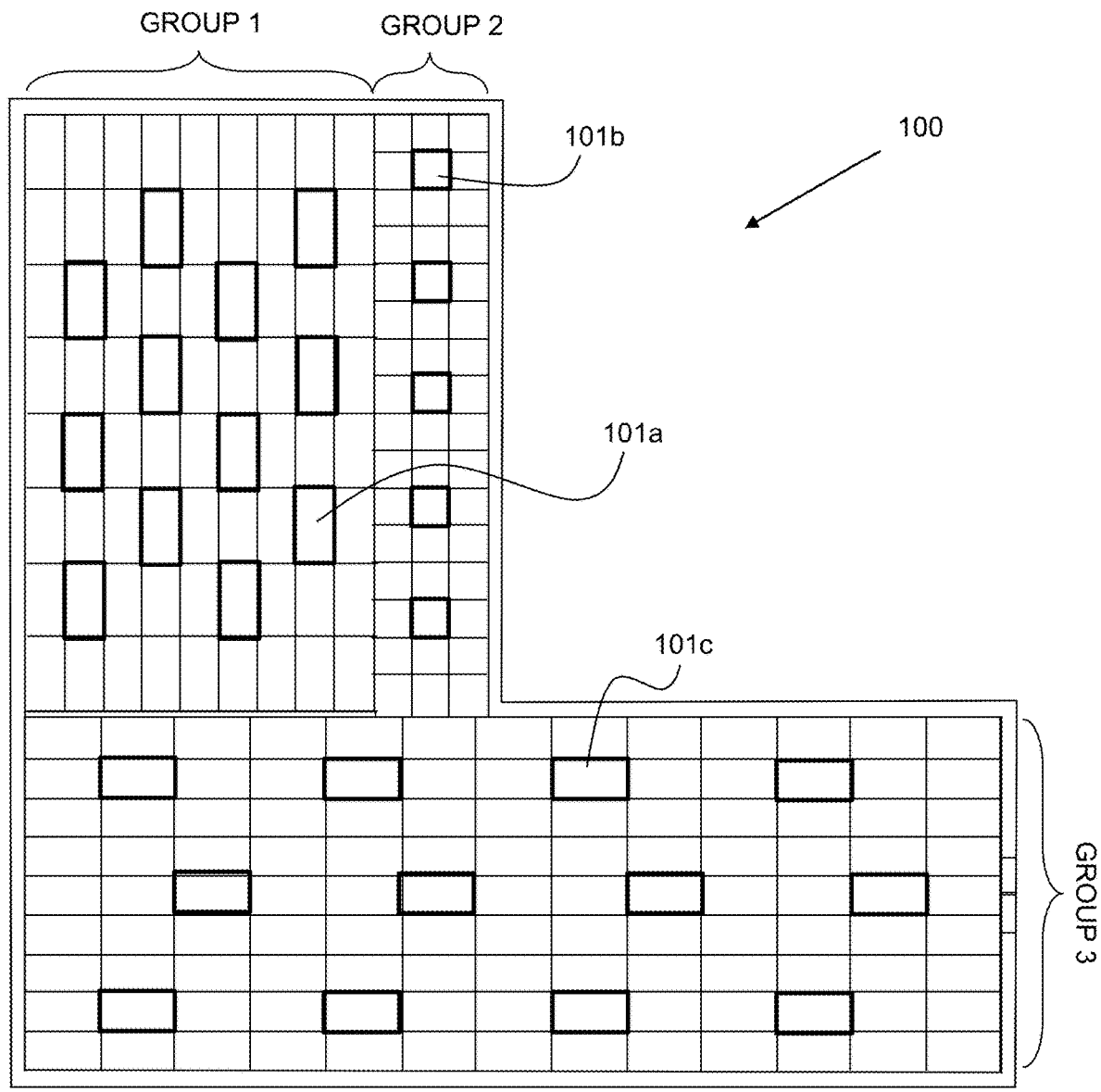
FIG. 1 illustrates a schematic diagram of an exemplary space that may correspond to a warehouse or large retail space with light sources.

FIG. 1 illustrates a schematic diagram of an exemplary space 100 that may correspond to a warehouse or large retail space. The space 100 employs a number of light sources 101 (e.g., light fixtures, etc.) to provide lighting. Different areas within the space 100, however, may have different lighting requirements. As such, the light sources 101 may be divided into lighting groups. FIG. 1 illustrates three lighting groups: GROUP 1, GROUP 2, and GROUP 3. Light sources in a group may be controlled differently from light sources in another group. For example, the light source 101a in GROUP 1 may be controlled to have a different intensity of light from the intensity of light source 101b in GROUP 2. In another example, the light source 101a in GROUP 1 may be controlled to have a different light color temperature from the color temperature of light source 101c in GROUP 3. In yet another example, the light source 101b in GROUP 2 may be controlled to remain on at all times while the light source 101c in GROUP 3 may be turn on and off based on the time of day.

The commissioning process may include assigning the individual light sources 101 to their respective group. During an initial set up (prior to regular use) a manufacturer's representative or other technician may set up or program commissioning information into the light sources 101 including, for example, the respective lighting group.

Figure 2:
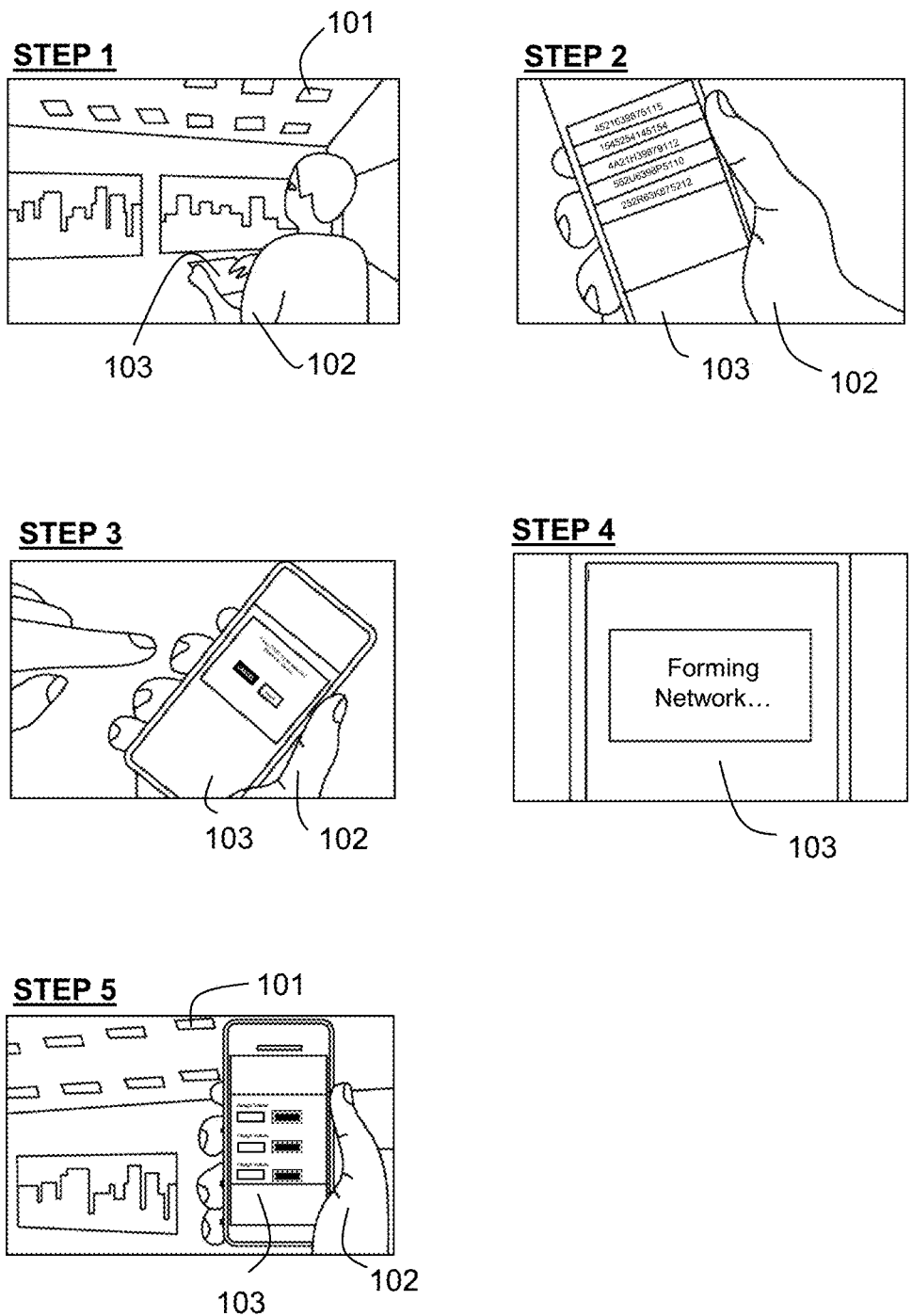
FIG. 2 illustrates a schematic diagram of an exemplary commissioning process.

FIG. 2 illustrates a schematic diagram of an exemplary commissioning process. At Step 1, a manufacturer's representative or other technician (user 102) may walk the space 100 carrying a computing device 103 such as a tablet or smartphone.

Light sources 101 (or their controlling device) may each be capable of establishing a network with the computing device 103 using a known wireless technology standard or protocol (e.g., Bluetooth®, Wi-Fi®, etc.). Each light source 101 (or their controlling device) may constantly transmit advertising data payloads to let the computing device 103 know that it exists (e.g., Generic Access Profile (GAP)). At step 2, the computing device 103 may display a list of light sources 101 detected.

At Step 3, the user 102 may select a light source 101 to be commissioned from those listed by the computing device 103. At Step 4, upon selection by the user 102, a network may be formed between the computing device 103 and the selected light source 101 or its controlling device using the known wireless technology standard or protocol (e.g., Generic Attribute Profile (GATT)). A network key may be necessary to establish the network connection. The connected light source 101 may flash to confirm the network connection.

Once a network has been established, commissioning information may be transmitted by the computing device 103 via the network. Commissioning information may be pre-programmed for the computing device 103 to transmit to the light source 101 or its controlling device. At step 5, the user 102 may use the computing device 103 to adjust or fine-tune settings for the light source 101 currently networked with the mobile device. Once a light source 101 has been commissioned, the user 102 may disconnect the computing device 103 from the formed network and repeat the process for every other light source in the space 100.

The process of FIG. 2 is time-consuming. In some cases, commissioning of a single light source can take up to two minutes. Commissioning of relatively large, commercial or industrial settings (which may include hundreds or thousands of light sources) using this process may take days or even weeks. The process also significantly depends on a technician's ability, which may make it inconsistent and mistake prone. This may be costly.

Figure 3A:
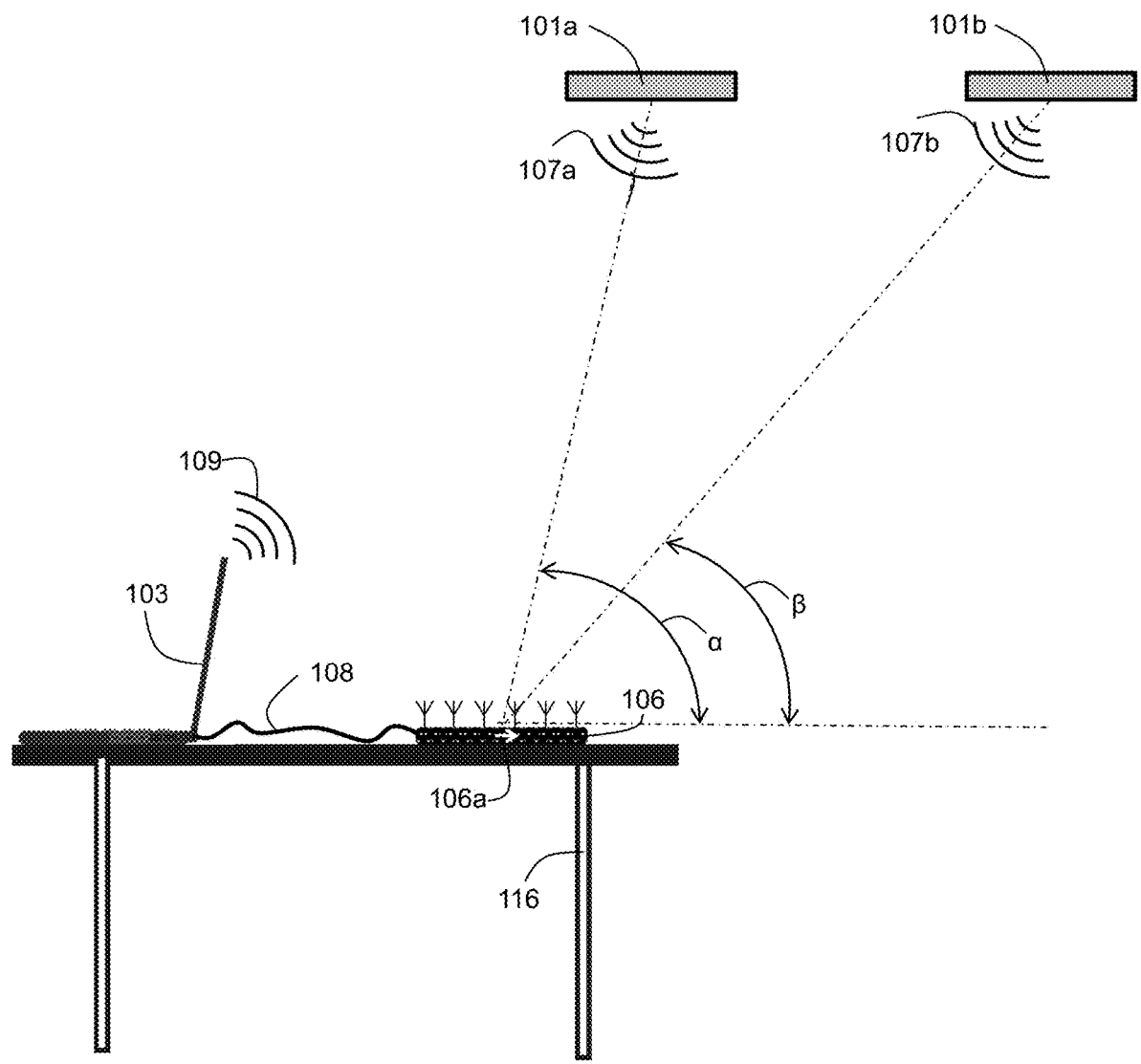
FIGS. 3a and 3B illustrate a schematic diagram of an exemplary lighting device commissioning system.
Figure 3B:
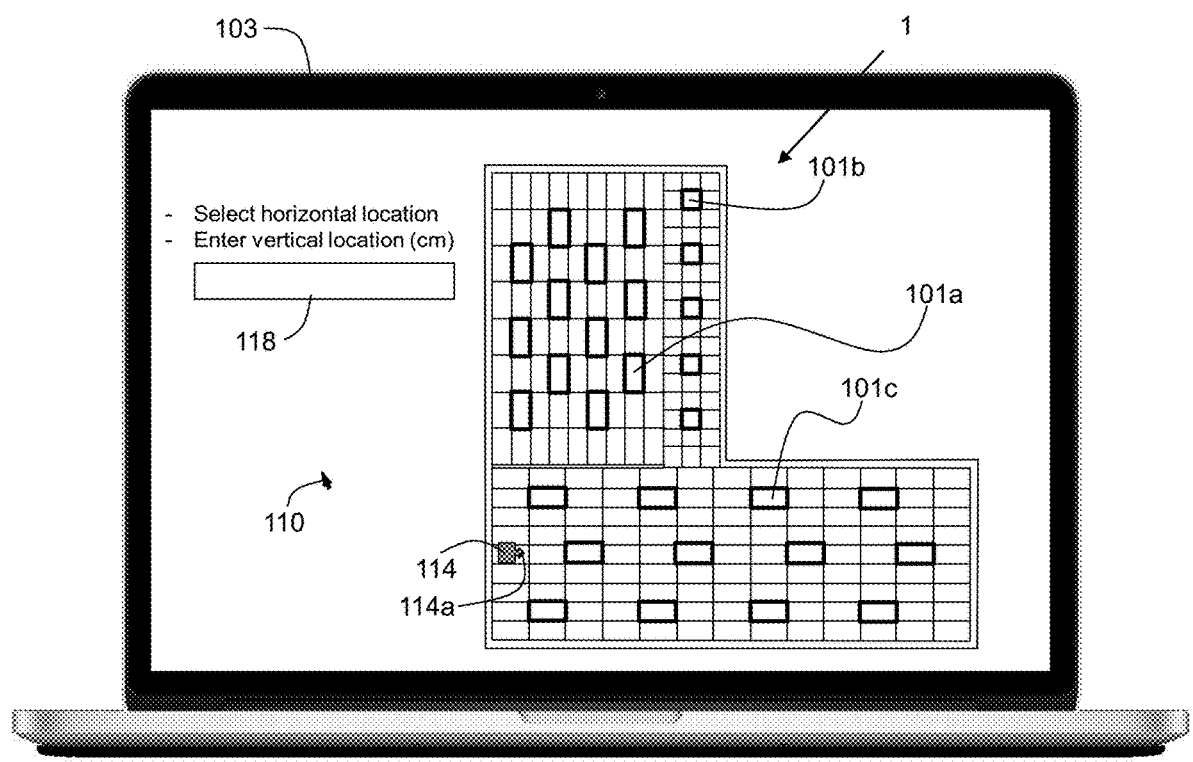

FIGS. 3A and 3B illustrate schematic diagrams of a commissioning system. The system may include one or more lighting devices or light sources 101a-b capable of storing identifying and commissioning information and capable of communicating (receive and transmit) wireless signals including beacon signals 107a-b. For purposes of simplicity of explanation this disclosure refers to the devices 101 as light sources. However, the devices 101 may include lighting devices in general that may need commissioning such as light fixtures, dimmers, sensors, controllers, etc. The light sources 101a-b may store the identifying and commissioning information and may communicate (receive and transmit) signals 107a-b themselves or the light sources 101a-b may be connected to or have stored therein controlling devices that may store the identifying and commissioning information and communicate (receive and transmit) signals 107a-b.

Beacon signals are low energy signals that transmitting devices may broadcast (often continuously and indiscriminately) and that receiving devices such as computers and smartphones may scan for and receive. Examples of beacon signals include iBeacon®, Eddystone®, Bluetooth® low energy (BLE) signals, etc. A common feature of beacon signals is that they contain a unique ID number. In some embodiments, the techniques disclosed herein use the unique ID number as a light source identifier. In other embodiments, however, the light source identifier may be part of portion or packet in the beacon signal other than the unique ID number. In some embodiments, the light source identifier may be a MAC address.

The system may also include a computing device 103 (e.g., laptop computer, smart phone, tablet, etc.) having installed thereon a commissioning program or application or having access to commissioning information and capable of communicating (receive and transmit) wireless signals. The computing device 103 may also be able to communicate through a network (e.g., Internet) to a remote storage that may have stored therein commissioning information. Via the network, the device 103 may receive the commissioning information from the remote storage.

The commissioning information may include the planned locations of the light sources 101 in 3D including horizontal location (as shown in FIG. 1) and vertical location (e.g., height relative to the floor). The commissioning information may also include information such as lighting group, operation timing, dimming specifics, intensity, color temperature, etc.

The system may also include an angle-of-arrival (AoA) array or receiver 106 connected to the computing device 103. For purposes of illustration, the AoA receiver 106 is shown in FIG. 3 as independent from computing device 103, connected by a cable 108. However, in some embodiments, the AoA receiver 106 may be inside of or part of computing device 103. The AoA receiver 106 may be used to measure the angles of arrival a and 13 of beacon signals 107a-b, respectively. Measurement of the angles of arrival can be done by determining the direction of propagation of the signals' 107 radio-frequency waves incident on the AoA receiver 106 antenna array. In one embodiment, the AoA device 106 is equipped with Bluetooth Direction Finding (BDF) AoA technology, a major feature of the Bluetooth® 5.1 Core specification. BDF can be used to detect location of beacon signal transmitting devices in either 2D or 3D.

As best seen on FIG. 3B, the computing device 103 may be used to display the space 1 and planned locations of the light sources 101 in the space 1. A user may use the graphical user interface of the computing device 103 to (e.g., using the cursor 110) move the symbol 114 (which symbolizes the AoA receiver 106 including an arrow that indicates relative orientation) to a horizontal location and orientation on the screen of the computing device 103 that corresponds to the actual horizontal location and orientation of the AoA receiver 106. The user may also enter a vertical location (i.e., height) of the AoA receiver 106. In the illustrated example, the AoA receiver 106 is shown in FIG. 3A resting on a table 116. The user may enter as a vertical location in the field 118 of FIG. 3B the height of the top surface of the table 116 on which the AoA receiver 106 is resting. The user may also rotate the symbol 114 so that its arrow 114a may align with a corresponding arrow 106a (or similar indicator of orientation) on the AoA receiver 106.

In summary, if the planned location of the light source 101a (including horizontal (as shown in FIG. 1) and vertical location) and the location (including horizontal and vertical location) and orientation of the AoA receiver 106 relative to the planned location of the light source 101a are known, the measured angle of arrival of the beacon signal 107a may be used to determine the actual location of the corresponding light source 101a. Then, the planned location of the light source 101a may be correlated to the actual location of the light source 101a to identify the installed light source 101a as corresponding to the planned light source 101a.

With the light source 101a identified, the computing device 103 (or another device) may transmit an incoming signal 109 carrying the corresponding commissioning information for light source 101a. The same process may be repeated for light source 101b and all other light sources 101 within range of the AoA receiver 106. For light sources 101 not within range of the AoA receiver 106, the setup of FIG. 3A may need to be moved along the space 1 to bring other light sources 101 within range of the AoA receiver 106. The system's range is limited by the energy of the signals including the beacon signals 107.

The process of FIGS. 3A and 3B may be used to accomplish commissioning relatively rapidly and accurately as compared to the process of FIG. 2. Time required for commissioning of relatively large, commercial or industrial settings (which may include hundreds or thousands of light sources) using this process of FIGS. 3A and 3B may be reduced significantly from the days or even weeks needed for the process of FIG. 2. A significant portion of the process of FIG. 2 is spent walking the space 1 and establishing individual, one-at-a-time network connections with each of the light sources 101. The process of FIGS. 3A and 3B reduces the need for a technician to walk the space 1. Moreover, since the computing device 103 is mostly responsible for identification and transmittal of commissioning information, errors should be significantly reduced. This may mean significant time and cost savings.

In one embodiment, prior to installation of the light source 101, perhaps during manufacturing, default commissioning information including a default value for the lighting group (e.g., GROUP 1) may be assigned to the light source 101 by, for example, storing it in memory. Assuming that most lighting installations would have a GROUP 1, storing of default commissioning information including GROUP 1 as the default value for the lighting group, may help save additional commissioning time. In one embodiment, during the same pre-installation process the light source identifier that uniquely identifies the light source may also be stored in memory.

Figure 4A:
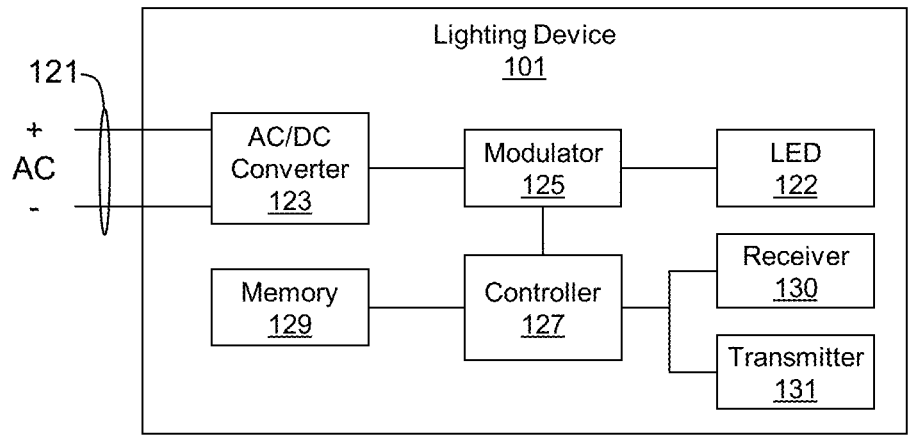
FIG. 4A illustrates a block diagram of an exemplary light source or lighting device.

FIG. 4A illustrates a block diagram of an exemplary lighting source or lighting device 101. The lighting device 101 may include an AC electrical connection 121 to connect to an external power source. In this example the lighting device 101 is an LED light source and, thus, includes the LED 122. The lighting device 101 may also include an AC/DC converter 123 to convert the AC to DC, a modulator 125 to switch the LED on and off as necessary to change, for example, intensity, color temperature, etc. The lighting device 101 may also include a controller 127 which controls operation of the lighting device 101 including control of the modulator 125.

The lighting device 101 may also include a memory 129 that stores commissioning information including, for example, a value for a lighting group assigned to the lighting device 101 and a stored light source identifier that uniquely identifies the lighting device 101. The lighting device 101 may also include a receiver 130 and a transmitter 131 that receive and transmit signals, respectively.

The transmitter 131 may transmit outgoing beacon signals. Each outgoing beacon signal may include a stored light source identifier that uniquely identifies the lighting device 101. The receiver 130 may receive incoming wireless signals carrying commissioning information.

Although in FIG. 4A the controller 127 is shown as controlling both the lighting and communication functions of the lighting device 101, in some embodiments, the lighting device 101 may include two or more controllers that may be used to control these and other functions. For example, a first controller may be used to control lighting functions while a second controller may be used to control communications. The controller 127, receiver 130, and transmitter 131 may be implemented in any combination of hardware and software and may include a processor. The processor can be a variety of various processors including dual microprocessor and other multi-processor architectures.

The memory 129 can include volatile memory or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

Although in FIG. 4A the receiver 130 and transmitter 131 are shown as discrete from each other, in some embodiments, the receiver 130 and transmitter 131 may be implemented as one transceiver interface that allows the lighting device 101 to communicate. The receiver 130 and transmitter 131 may interact with local area networks (LAN), wide area networks (WAN), personal area networks (PAN) and other networks. The receiver 130 and transmitter 131 may include and interact with communication technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth® (IEEE 802.15.1), Zigbee® (IEEE 802.15.4), iBeacon®, Eddystone®, and the like.

Figure 4B:
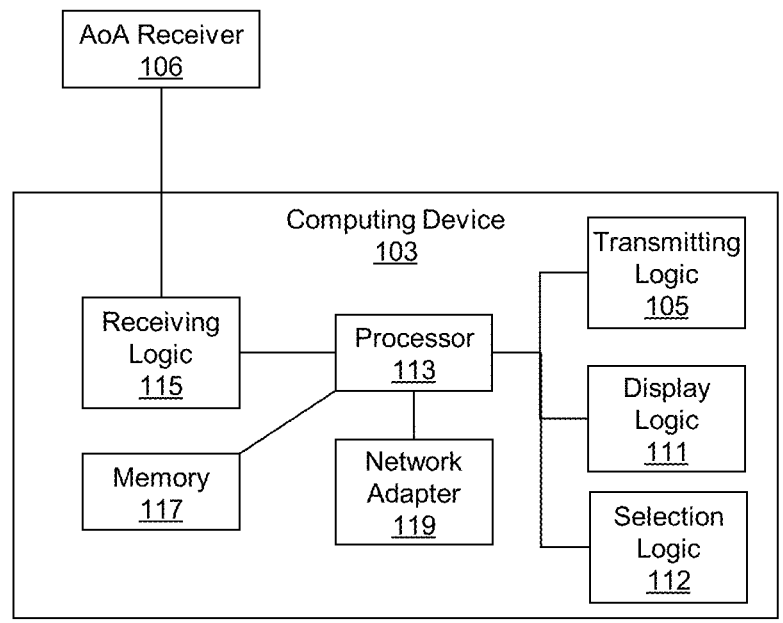
FIG. 4B illustrates a block diagram of an exemplary computing device and angle of arrival receiver.

FIG. 4B illustrates block diagrams of an exemplary computing device 103 and an exemplary AoA receiver 106. Although in FIG. 4B the AoA receiver 106 is shown outside of the computing device 103, in some embodiments, the AoA Receiver 106 may be part of the computing device 103.

The computing device 103 may include a processor 113, memory 117, and a network adapter 119 to send and receive information. The computing device 103 may also include a receiving logic 115 that works with the network adapter 119 to receive data from received beacon signals carrying respective light source identifiers that uniquely identify respective lighting devices 101. The computing device 103 may also include a display logic 111 that displays a mapping of lighting devices 101 as planned (e.g., in space 1) and a user selection logic 112 that detects user selection of the horizontal location and user indication of the vertical location of the AoA receiver 106.

The processor 113 may calculate the actual geographic locations of the light sources 101 based on the planned locations of the light sources 101, the actual geographic location/orientation of the AoA receiver 106, and the measured angles of arrival of the beacon signals 107. The processor 113 may also correlate the planned locations of the light sources 101 (and the corresponding commissioning information) to the actual location of the light sources 101 to identify the installed light sources 101 as corresponding to the planned light sources 101.

The computing device 103 may also include a transmitting logic 105 that works with the network adapter 119 to transmit corresponding commissioning information to the light sources 101.

The receiving 115, transmitting 105, display 111, and selection 112 logics can be implemented in any combination of hardware and software. The logics can be stored in memory 117 and run by the processor 113. The logics can be part of an application that runs on the computing device 103.

The processor 113 may be a generic CPU found in modern computing devices. The CPU 113 processes received information and sends relevant information to the network adapter 119. Additionally, the CPU 113 reads and writes information to memory 117. The CPU 113 can use any standard computer architecture. Common architectures for microcontroller devices include ARM and x86.

The network adapter 119 is the networking interface that allows the computing device 103, and the receiving logic 115 and the transmitting logic 105 to connect to cellular, Wi-Fi®, Bluetooth®, and other networks. The computing device 103 may use the network adapter 119 to access commissioning information from remote sources (e.g., remote server). However, obtaining this information can be accomplished without a data connection by storing data locally to the mobile device's 103 memory 117. The network adapter 119, however, allows for greater flexibility and decreases the resources needed locally at the computing device 103.

Although in FIG. 4B the receiving logic 115 and transmitting logic 105 are shown as discrete from each other, in some embodiments, they may be implemented as one transceiver interface that allows the computing device 103 to communicate. The receiving logic 115 and transmitting logic 105 may interact via the network interface 119 with local area networks (LAN), wide area networks (WAN), personal area networks (PAN), cellular data networks (Edge, 3G, 4G, LTS, CDMA, GSM, LTE, etc.), and other networks. The receiver 130 and transmitter 131 may include and interact with communication technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth® (IEEE 802.15.1), Zigbee® (IEEE 802.15.4), iBeacon®, Eddystone®, and the like.

The AoA receiver 106 may include an antenna array and may be equipped with Bluetooth Direction Finding (BDF) AoA technology, a major feature of the Bluetooth® 5.1 Core specification. BDF can be used to detect location of beacon signal transmitting devices in either 2D or 3D. Nordic® Semiconductor nRF5XXXx line of system-on-chip integrated circuits is an example of a solution that may be used to implement the AoA receiver 106.

Figure 5:
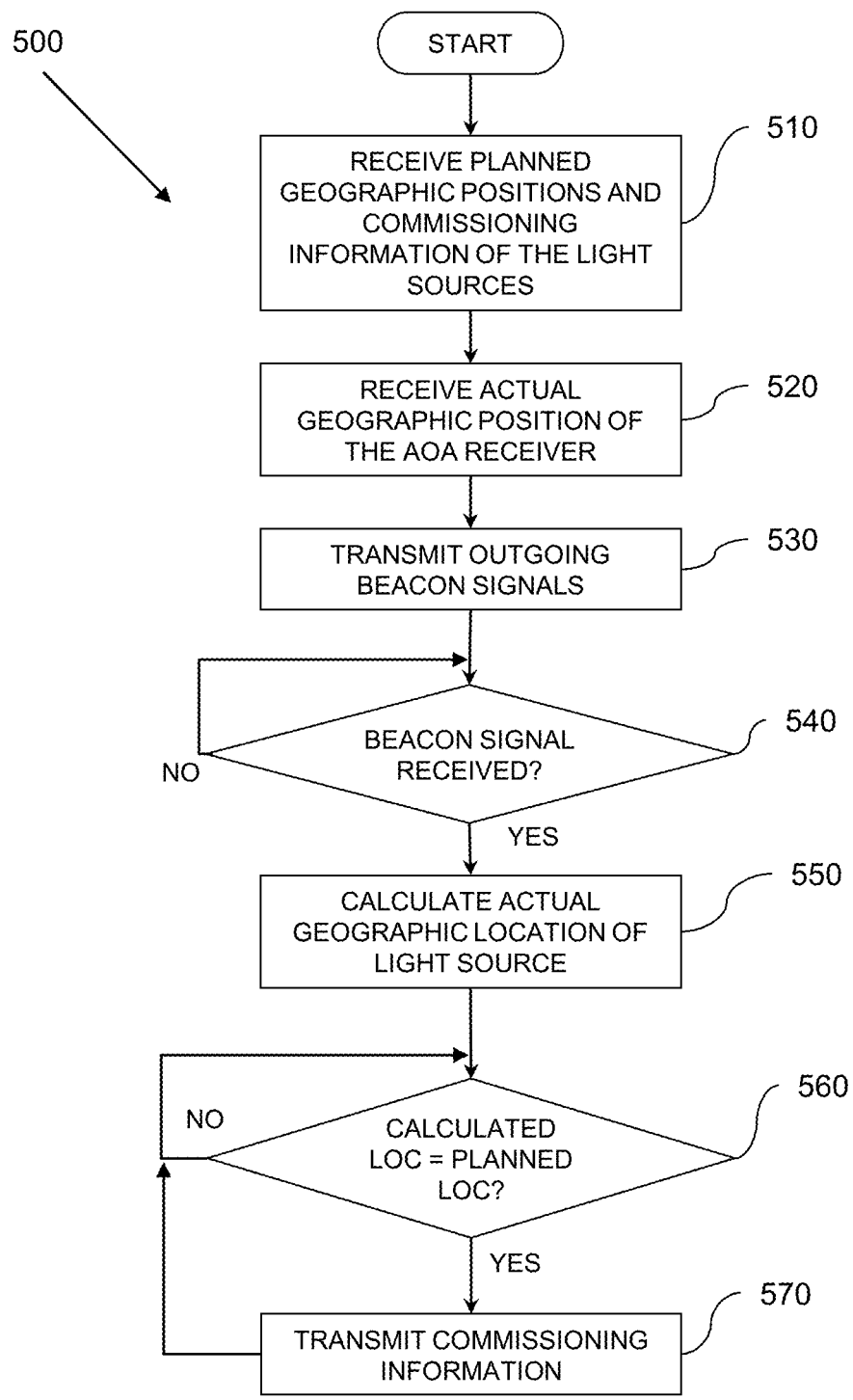
FIG. 5 illustrates a flow diagram for an exemplary method for commissioning of a light source.

Exemplary methods may be better appreciated with reference to the flow diagram of FIG. 5. While for purposes of simplicity of explanation, the illustrated methodologies are shown and described as a series of blocks, it is to be appreciated that the methodologies are not limited by the order of the blocks, as some blocks can occur in different orders or concurrently with other blocks from that shown and described. Moreover, less than all the illustrated blocks may be required to implement an exemplary methodology. Furthermore, additional methodologies, alternative methodologies, or both can employ additional blocks, not illustrated.

In the flow diagrams, blocks denote "processing blocks" that may be implemented with logic. The processing blocks may represent a method step or an apparatus element for performing the method step. The flow diagrams do not depict syntax for any particular programming language, methodology, or style (e.g., procedural, object-oriented). Rather, the flow diagrams illustrate functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown or that blocks may be combined or separated into multiple components. It will be appreciated that the processes may be implemented using various programming approaches like machine language, procedural, object oriented or artificial intelligence techniques.

FIG. 5 illustrates a flow diagram for an exemplary method 500 for commissioning of a light source. At 510, the computing device 103 may receive data indicating planned geographic positions of the light sources 101 and data representing commissioning information of the light sources 101. At 520, the computing device 103 may receive data indicating an actual geographic position of the angle of arrival receiver 106 relative to the planned geographic positions of the light sources 101. At 530, the light sources 101 may transmit outgoing beacon signals 107, each outgoing beacon signal including a stored light source identifier that uniquely identifies the light source 101. At 540, the angle of arrival receiver 106 may receive beacon signals including the outgoing beacon signals 107. The beacon signals carry respective light source identifiers that uniquely identify respective light sources 101. At 550, the computing device 103 may calculate actual geographic positions of the light sources 101 based on a) the actual geographic position of the angle of arrival receiver 106 relative to the planned geographic positions of the light sources 101 and b) respective angles of arrival of the beacon signals 107. At 560, the computing device 103 may compare the planned geographic positions to the actual geographic positions to correlate the commissioning information to the light source identifiers. At 570, the computing device 103 may transmit the correlated light source identifiers and commissioning information to the respective light sources 101.

While the figures illustrate various actions occurring in serial, it is to be appreciated that various actions illustrated could occur substantially in parallel, and while actions may be shown occurring in parallel, it is to be appreciated that these actions could occur substantially in series. While a number of processes are described in relation to the illustrated methods, it is to be appreciated that a greater or lesser number of processes could be employed and that lightweight processes, regular processes, threads, and other approaches could be employed. It is to be appreciated that other exemplary methods may, in some cases, also include actions that occur substantially in parallel. The illustrated exemplary methods and other embodiments may operate in real-time, faster than real-time in a software or hardware or hybrid software/hardware implementation, or slower than real time in a software or hardware or hybrid software/hardware implementation.

While example systems, methods, and so on, have been illustrated by describing examples, and while the examples have been described in considerable detail, it is not the intention to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, and illustrative examples shown or described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

Definitions

The following includes definitions of selected terms employed herein. The definitions include various examples or forms of components that fall within the scope of a term and that may be used for implementation. The examples are not intended to be limiting. Both singular and plural forms of terms may be within the definitions.

"Data store" or "database," as used herein, refers to a physical or logical entity that can store data. A data store may be, for example, a database, a table, a file, a list, a queue, a heap, a memory, a register, and so on. A data store may reside in one logical or physical entity or may be distributed between two or more logical or physical entities.

"Logic," as used herein, includes but is not limited to hardware, firmware, software or combinations of each to perform a function(s) or an action(s), or to cause a function or action from another logic, method, or system. For example, based on a desired application or needs, logic may include a software-controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

"Signal," as used herein, includes but is not limited to one or more electrical or optical signals, analog or digital signals, data, one or more computer or processor instructions, messages, a bit or bit stream, or other means that can be received, transmitted, or detected.

In the context of signals, an "operable connection," or a connection by which entities are "operably connected," is one in which signals, physical communications, or logical communications may be sent or received. Typically, an operable connection includes a physical interface, an electrical interface, or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical or physical communication channels can be used to create an operable connection.

To the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components. An "operable connection," or a connection by which entities are "operably connected," is one by which the operably connected entities or the operable connection perform its intended purpose. An operable connection may be a direct connection or an indirect connection in which an intermediate entity or entities cooperate or otherwise are part of the connection or are in between the operably connected entities.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (3D. Ed. 1995).

What is claimed is:

1. A system for commissioning of a light source, comprising:
    an angle of arrival receiver configured to receive beacon signals;
    a processor operably connected to the angle of arrival receiver and configured to receive:
        data indicating planned geographic positions of light sources including a planned geographic position of the light source,
        data representing commissioning information of the light sources including commissioning information of the light source, and
        data indicating an actual geographic position of the angle of arrival receiver relative to the planned geographic positions of the light sources;
    a lighting device including a first transmitter configured to transmit outgoing beacon signals, each outgoing beacon signal including a stored light source identifier that uniquely identifies the light source;
    the angle of arrival receiver configured to receive beacon signals including the outgoing beacon signals, the beacon signals carrying respective light source identifiers that uniquely identify respective light sources, the outgoing beacon signals carrying the stored light source identifier;
    the processor configured to calculate actual geographic positions of the light sources, including a calculated geographic position of the light source, based on a) the actual geographic position of the angle of arrival receiver relative to the planned geographic positions of the light sources and b) respective angles of arrival of the beacon signals, the processor further configured to compare the planned geographic positions to the actual geographic positions to correlate the commissioning information to the light source identifiers; and
    a transmitting logic operably connected to the processor and configured to transmit the correlated light source identifiers and commissioning information to the respective light sources including the light source.

2. The system of claim 1, wherein the first transmitter includes a Bluetooth® Low Energy (BLE) Mesh device.

3. The system of claim 1, wherein the commissioning information is predefined and stored, the transmitting logic having access to the commissioning information from a local memory or from communication with a remote storage.

4. The system of claim 1, comprising:
    a user interface configured to display a lighting plan mapping including the planned geographic positions of light sources and to receive user input indicating the actual geographic position of the angle of arrival receiver relative to the planned geographic positions of the light sources on the lighting plan mapping.

5. The system of claim 1, wherein the transmitting logic includes a Bluetooth® Low Energy (BLE) Mesh device.

6. A system for commissioning of a light source, comprising:
    an angle of arrival receiver configured to receive beacon signals;
    a processor operably connected to the angle of arrival receiver and configured to receive:
        data indicating planned geographic positions of light sources including a planned geographic position of the light source, data representing commissioning information of the light sources including commissioning information of the light source, and data indicating an actual geographic position of the angle of arrival receiver relative to the planned geographic positions of the light sources;

the angle of arrival receiver configured to receive beacon signals, the beacon signals carrying respective light source identifiers that uniquely identify respective light sources, the beacon signals including outgoing beacon signals transmitted by the light source, each outgoing beacon signal carrying a stored light source identifier that uniquely identifies the light source;

the processor configured to calculate actual geographic positions of the light sources, including a calculated geographic position of the light source, based on a) the actual geographic position of the angle of arrival receiver relative to the planned geographic positions of the light sources and b) respective angles of arrival of the beacon signals, the processor further configured to compare the planned geographic positions to the actual geographic positions to correlate the commissioning information to the light source identifiers; and a transmitting logic operably connected to the processor and configured to transmit the correlated light source identifiers and commissioning information to the respective light sources including the light source.

7. The system of claim 6, wherein the angle of arrival receiver is equipped with Bluetooth Direction Finding (BDF).

8. The system of claim 6, wherein the commissioning information is predefined and stored, the transmitting logic having access to the commissioning information from a local memory or from communication with a remote storage.

9. The system of claim 6, comprising:

a user interface configured to display a lighting plan mapping including the planned geographic positions of light sources and to receive user input indicating the actual geographic position of the angle of arrival receiver relative to the planned geographic positions of the light sources on the lighting plan mapping.

* * * * *